(12) United States Patent
Janke

(10) Patent No.: US 6,999,333 B2
(45) Date of Patent: Feb. 14, 2006

(54) METHOD AND APPARATUS FOR ASSESSING ONE-TIME PROGRAMMABLE CELLS

(75) Inventor: Marcus Janke, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/835,091

(22) Filed: Apr. 28, 2004

(65) Prior Publication Data

US 2004/0252540 A1    Dec. 16, 2004

(30) Foreign Application Priority Data

Apr. 29, 2003 (DE) ............................... 103 19 273

(51) Int. Cl.
  *G11C 17/00* (2006.01)
(52) U.S. Cl. .................................. 365/94; 365/189.07
(58) Field of Classification Search ................ 365/94, 365/189.07

See application file for complete search history.

(56) References Cited

U.S. PATENT DOCUMENTS

| 5,635,854 A | 6/1997 | Shimanek et al. |
| 6,396,742 B1 | 5/2002 | Korsch et al. |
| 6,798,684 B2 * | 9/2004 | Low et al. ................. 365/96 |
| 2002/0190348 A1 | 12/2002 | Anma |
| 2004/0042274 A1 | 3/2004 | Low et al. |

FOREIGN PATENT DOCUMENTS

| DE | 199 20 721 A1 | 11/2000 |
| DE | 100 26 251 A1 | 12/2001 |
| EP | 0 252 325 A2 | 1/1988 |
| EP | 1 233 453 A2 | 8/2002 |

* cited by examiner

*Primary Examiner*—Michael Tran
(74) *Attorney, Agent, or Firm*—Darby & Darby

(57) ABSTRACT

Provision is made of a method and an apparatus for assessing one-time programmable cells, in which an electrical characteristic quantity of a cell is ascertained. This electrical characteristic quantity is compared with a first predetermined threshold value and a second predetermined threshold value, and a signal signaling an uncertain programming state is produced if the electrical characteristic quantity is between the first predetermined threshold value and the second predetermined threshold value.

11 Claims, 1 Drawing Sheet

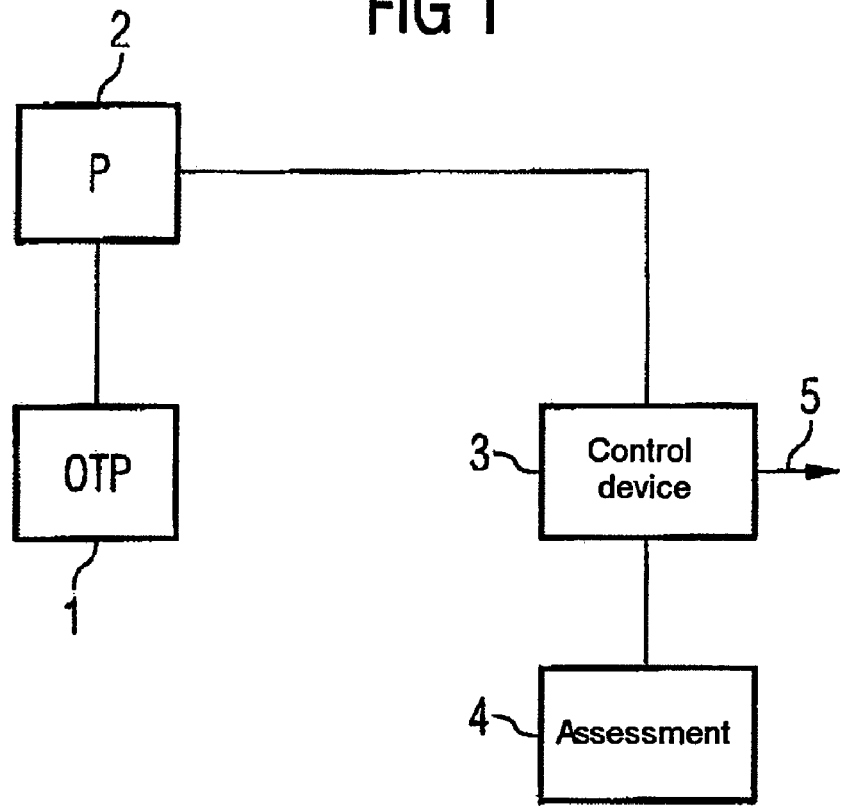
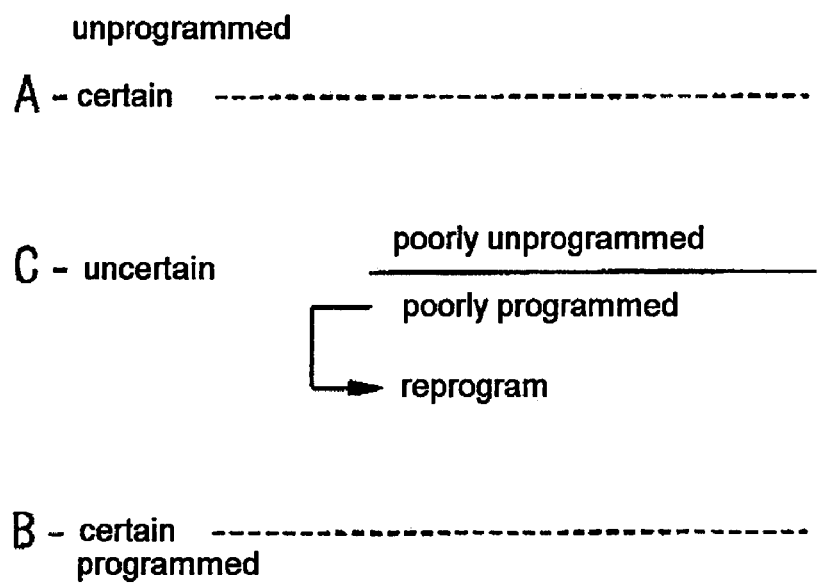

METHOD AND APPARATUS FOR ASSESSING ONE-TIME PROGRAMMABLE CELLS

CROSS-REFERENCE TO RELATED APPLICATION

This application claims priority to DE 10319273.5, which was filed on Apr. 29, 2003, and is incorporated herein by reference in its entirety.

FIELD OF THE INVENTION

The invention relates to a method and an apparatus for assessing one-time programmable cells in accordance with the coordinate patent claims.

BACKGROUND OF THE INVENTION

One-time programmable cells, so-called "OTPs", are used multifariously in semiconductor technology. They are used to allow the user to put a semiconductor chip into a state, which he desires and which is then intended to be no longer capable of being changed. To this end, one or an arbitrary number of one-time programmable cells may be arranged on one chip. Said cells may in this case be connected in order, for example, to be able to program a number (which results from the number of cells) in accordance with the bits available. Prescribed characteristics which are intended to be no longer capable of being changed may likewise be subsequently programmed using particular cells. This is effected to such an extent that, in the case of so-called DRAM modules having redundant memory cells, for example, one-time programmable memory cells are used to program access possibilities in such a manner that areas having defective memory cells are blocked, with the result that the latter are no longer accessed.

In the case of one-time programmable cells, a distinction is usually made between so-called "fuses" and so-called "anti-fuses". The so-called "fuse" corresponds to a line interruption, while the so-called "anti-fuse" corresponds to the production of a line connection. The programmed state of the "fuse" or "anti-fuse" is ascertained, for example, by ascertaining a voltage drop across said cell or the current flow through said cell. In the case of a so-called "fuse", a current flow may be detected in the unprogrammed state when the voltage drop is minimal, these electrical characteristic quantities being reversed in the programmed state, with the result that, in the programmed state, a high voltage drop then appears when the current flow is minimal. In the case of the so-called "anti-fuse", the electrical characteristic quantities are exactly the inverse of those of the so-called "fuse" in the unprogrammed and programmed states. One-time programmable cells of this type and circuits for programming them are described, for example, in US2002/0190348A1, EP1233453A2 and DE 100 26 251 A1. These one-time programmable cells are usually programmed using an increased voltage or an increased current, so that a previously existing state is irreversibly destroyed.

However, depending on the type of programmable cell, it also happens often enough that the transition from conductive to non-conductive or vice versa is not permanently 100% achieved. This means that, for example when there is not 100% destruction, the cell changes its state toward the unprogrammed state during operation as a result of migration.

This problem has hitherto been circumvented by designing the "fuses" and "anti-fuses" to be so sensitive that programming is carried out using a very high safety/security margin since reprogramming was impossible. This is particularly disadvantageous when, in the case of a component having a long lifetime, the programming is changed in the course of operation, for example as a result of electromigration, as previously indicated. In many applications, this means a reduction in the operational reliability of the component.

SUMMARY OF THE INVENTION

The invention is thus based on the object of providing a method and an apparatus for assessing one-time programmable cells, so that high operational reliability can be achieved even in the case of a long service life. According to the invention, this object is achieved by the measures specified in the coordinate patent claim.

As a result of the fact that an electrical characteristic quantity of the one-time programmable cell is compared with a first and a second threshold value, it is possible to detect and signal an uncertain programming state, so that targeted reprogramming or sorting-out of a module which has been uncertainly programmed in this manner is possible.

Advantageous refinements of the invention are specified in the subordinate patent claims.

In particular, as a result of the fact that a third threshold is provided, it is possible to ascertain a state from which it is indeed possible to detect an uncertain programming state but in the case of which either the module is separated out or no further action whatsoever is taken. On the other hand, it is possible, by taking this third threshold into account, to detect a state which may be uncertainly programmed and in which renewed programming leads to a certain programming state.

BRIEF DESCRIPTION OF THE DRAWINGS

The invention is explained in more detail below using an exemplary embodiment and with reference to the drawing, in which:

FIG. 1 shows an exemplary embodiment of an apparatus for assessing one-time programmable cells, and FIG. 2 shows an illustration of assessment thresholds.

DETAILED DESCRIPTION OF THE PREFERRED MODE OF THE INVENTION

FIG. 1 shows a one-time programmable cell 1, which is driven and read by a control device 3. In this case, the programming state is detected using an electrical characteristic quantity. If the one-time programmable cell is a so-called "fuse", an unprogrammed state may therefore be detected, for example, as a result of the fact that it is possible to detect a current flow through the one-time programmable cell 1, whereas, in the programmed state, no current or a minimal current can be detected. The control device 3 outputs the detected programming state as a signal at an output 5. The control device 3 is furthermore connected to an assessment device 4, in which it ascertains the value of the checked and detected electrical characteristic quantity. The assessment device 4 compares the detected electrical characteristic quantity using at least a first threshold value A and a second threshold value B and carries out an assignment in accordance with the assignment table shown in FIG. 2. If the electrical characteristic quantity is between the first threshold A and the second threshold B, an uncertain programming state is present. If the electrical characteristic quantity is above the threshold A, an unprogrammed state is definitely present and, if the electrical characteristic quantity is below the second threshold B, a programmed state is definitely present.

In order to improve understanding, it should be mentioned here that the statement "above or below a threshold" is to be understood relatively. If the current flow is ascertained as the electrical characteristic quantity, an unprogrammed state is definitely present above a first threshold A in the case of a one-time programmable cell which is a "fuse". By contrast, if the one-time programmable cell is an "anti-fuse", the assignment is applicable only when a voltage is detected as the electrical characteristic quantity. The same applies correspondingly to the second threshold B.

If the assessment device 4 has therefore ascertained the programming state, the latter is communicated to the control device in accordance with this exemplary embodiment shown in FIG. 1, whereupon said control device determines the value of the output signal at the output 5 if a certain state is present. If, however, an uncertain state is present, provision is made for reprogramming. To this end, the control device 3 causes a programming device 2 to reprogram the corresponding one-time programmable cell 1. This means that a current is once again injected, for example, into a one-time programmable cell (which is a so-called "fuse"), so that the obviously poorly conductive connection is completely interrupted. This may be repeated until it is signaled to the control device, for example by reading of the cell by the control device and assessment by the assessment device 4, that a certain programming state has been achieved.

In a further advantageous exemplary embodiment, provision is made for a third threshold C to be provided, said third threshold subdividing the region of the assignment of uncertain programming into two regions again. If the detected electrical characteristic quantity is between the third threshold C and the first threshold A in the region of uncertain programming, a poorly unprogrammed state is present, this resulting, in accordance with the present exemplary embodiment, in either no further measure being taken of the component being disabled. This would be effected by the control device outputting a corresponding signal at the output 5. If the detected electrical characteristic quantity is between the threshold C and the threshold B in the uncertain region, a state of poor programming is present, with the result that reprogramming is carried out, as already previously explained.

For programming or reprogramming the one-time programmable cell, it is possible, for example, to use so-called charge pumps (as are used, for example, for programming EEPROM cells) in order to program the one-time programmable cells. This makes it possible to obviate the need to provide additional circuit measures on an integrated circuit in order to provide for reprogramming (which has hitherto not been possible) of the programmable memory cell.

In order to complete the explanation, it should also be added that the programming state has hitherto been measured from the fact of whether the electrical characteristic quantity is above or below a threshold. The state to be assigned, then, if the electrical characteristic quantity is precisely at the threshold, is at the discretion of the operator establishing the thresholds. Provision may also correspondingly be made for the accuracy with which the electrical characteristic quantity is detected to be so great that the detected value is always above or below one of the thresholds provided.

What is claimed is:

1. A method for assessing one-time programmable cells in which an electrical characteristic quantity of a cell, on which programming has been attempted, is ascertained, the method comprising the steps of:
   comparing the electrical characteristic quantity with a first predetermined threshold value;
   comparing the electrical characteristic quantity with a second predetermined threshold value; and
   producing a first signal signaling an undetermined programming state if the electrical characteristic quantity is between the first predetermined threshold value and the second predetermined threshold value.

2. The method as claimed in claim 1, further comprising the step of, when the electrical characteristic quantity is above the first threshold value, producing a second signal signaling an unprogrammed programming state.

3. The method as claimed in claim 1, further comprising the step of, when the electrical characteristic quantity is below the second threshold value, producing a third signal indicating a programmed programming state.

4. A method for assessing one-time programmable cells in which an electrical characteristic quantity of a cell is ascertained, the method comprising the steps of:
   comparing the electrical characteristic quantity with a first predetermined threshold value;
   comparing the electrical characteristic quantity with a second predetermined threshold value;
   producing a first signal signaling an undetermined programming state if the electrical characteristic quantity is between the first predetermined threshold value and the second predetermined threshold value; and
   when the signal signaling an undetermined programming state is produced, programming the cell such that the electrical characteristic quantity is outside the region between the first threshold value and the second threshold value.

5. A method for assessing one-time programmable cells in which an electrical characteristic quantity of a cell is ascertained, the method comprising the steps of:
   comparing the electrical characteristic quantity with a first predetermined threshold value;
   comparing the electrical characteristic quantity with a second predetermined threshold value; and
   producing a first signal signaling an undetermined programming state if the electrical characteristic quantity is between the first predetermined threshold value and the second predetermined threshold value,
   wherein the electrical characteristic quantity which is between the first threshold value and the second threshold value is compared with a third threshold value.

6. The method as claimed in claim 5, further comprising the steps of:
   when the electrical characteristic quantity is between the first threshold value and the third threshold value, producing a fourth signal; and
   in response to the production of the fourth signal, detecting a poorly unprogrammed state of the cell.

7. The method as claimed in claim 5, further comprising the steps of:
   when the electrical characteristic quantity is between the second threshold value and the third threshold value, producing a fifth signal; and
   in response to the production of the fifth signal, programming the cell such that the electrical characteristic quantity is below the second threshold value.

8. An apparatus for assessing one-time programmable cells on which programming has been attempted, comprising:
- a control device, which reads an electrical characteristic quantity from at least one one-time programmable cell; and
- an assessment device, which is connected to the control device, and which compares the electrical characteristic quantity with at least a first threshold value and a second threshold value and emits a comparison result indicating an uncertain programming state.

9. The apparatus as claimed in claim 8, further comprising a programming device, which programs the at least one programmable cell when a predetermined comparison result is present.

10. The apparatus as claimed in claim 8, wherein the electrical characteristic quantity is between the first and second threshold values, indicating an undetermined programming state.

11. An apparatus for assessing one-time programmable cells comprising:
- a control device, which reads an electrical characteristic quantity from at least one one-time programmable cell;
- an assessment device, which is connected to the control device, and which compares the electrical characteristic quantity with at least a first threshold value and a second threshold value and emits a comparison result; and
- a programming device, which programs the at least one programmable cell when a predetermined comparison result is present, wherein the programming device is connected to the control device, and the control device sends a signal to the programming device to reprogram the at least one cell when the control device receives, from the assessment device, a signal signaling a predetermined comparison result.

* * * * *